(12) United States Patent
Bhatnagar et al.

(10) Patent No.: US 6,391,146 B1
(45) Date of Patent: May 21, 2002

(54) EROSION RESISTANT GAS ENERGIZER

(75) Inventors: Ashish Bhatnagar, San Jose; Kartik Ramaswamy, Santa Clara; Tony S. Kaushal, Cupertino; Kwok Manus Wong; Shamouil Shamouilian, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/547,423

(22) Filed: Apr. 11, 2000

(51) Int. Cl.$^7$ .............................. H05H 1/00; C23C 16/00
(52) U.S. Cl. .................... 156/345; 118/715; 118/723 R; 118/723 E; 118/723 I; 118/723 MW
(58) Field of Search ......................... 156/345; 118/715, 118/723 E, 723 R, 723 MN, 723 I, 723 ER

(56) References Cited

U.S. PATENT DOCUMENTS

| | | | |
|---|---|---|---|
| 3,983,021 A | 9/1976 | Henis | 204/164 |
| 4,244,743 A | 1/1981 | Blackburn et al. | |
| 4,479,443 A | 10/1984 | Faldt et al. | 110/346 |
| 4,735,633 A | 4/1988 | Chiu | 55/2 |
| 4,753,915 A | 6/1988 | Vogt et al. | 502/304 |
| 4,788,036 A | 11/1988 | Eiselstein et al. | 420/448 |
| 4,954,320 A | 9/1990 | Birmingham et al. | 422/186.04 |
| 4,966,611 A | 10/1990 | Schumacher et al. | 55/20 |
| 5,137,701 A | 8/1992 | Mundt | 423/210 |
| 5,149,378 A | * 9/1992 | Ohmi et al. | 118/725 |
| 5,151,116 A | 9/1992 | Scholz et al. | 55/387 |
| 5,176,897 A | 1/1993 | Lester | 423/659 |
| 5,187,344 A | 2/1993 | Mizuno et al. | 219/121.5 |
| 5,191,184 A | 3/1993 | Shin | 219/10.55 R |
| 5,280,012 A | 1/1994 | Kirlin et al | |
| 5,366,585 A | 11/1994 | Robertson et al. | |
| 5,417,934 A | 5/1995 | Smith et al. | 422/177 |

(List continued on next page.)

FOREIGN PATENT DOCUMENTS

| | | |
|---|---|---|
| DE | 215706 | 11/1984 |
| DE | 3543802 | 6/1987 |
| DE | 4319118 A1 | 12/1994 |
| DE | 9421671 | 8/1996 |
| EP | 0849767 | 6/1998 |
| IL | WO 992726 | 6/1999 |
| JP | 51129868 | 11/1976 |
| JP | 5845718 | 3/1983 |
| JP | 39768 | 2/1991 |
| JP | 08227041 | 3/1998 |
| JP | 10192653 | 7/1998 |
| WO | 9814980 | 9/1997 |

OTHER PUBLICATIONS

Complete copy of the "ASTRON™ Atomic Fluorine Generator Model AX7650 Installation and Operations Manual," dated Dec. 24, 1998.

"ASTRON™—Atomic Fluorine Generator" web site page (1 sheet) located at www.astex.com.

Applied Materials, Inc. Patent Application for Docket No. 2803, titled, "A Ceramic Composition for an Apparatus and Method for Processing a Substrate." No date.

PCT Search Report dated Oct. 24, 2001, European Patent Office, P.B. 5818 Patentlaan 2, NL–2280 HV Risjswijk.

*Primary Examiner*—Gregory Mills
*Assistant Examiner*—P. Hassanzadeh
(74) *Attorney, Agent, or Firm*—Janah & Associates

(57) ABSTRACT

An apparatus and method for reducing hazardous gases exhausted from a process chamber 25 includes an effluent gas treatment system 200 with a gas energizing reactor 210 with an erosion resistant inner surface 280. Optionally, an additive gas source 230 may be provided to introduce additive gas into the gas energizing reactor 210. In one embodiment, the inner surface comprises a fluorine-containing compound. In another embodiment, the inner surface comprises an oxide and a stabilizing agent.

50 Claims, 4 Drawing Sheets

U.S. PATENT DOCUMENTS

| | | | |
|---|---|---|---|
| 5,439,568 A | 8/1995 | Uchiyama | 204/164 |
| 5,453,125 A | 9/1995 | Krogh | 118/723 MR |
| 5,498,313 A | 3/1996 | Bailey et al. | |
| 5,510,066 A | 4/1996 | Fink et al. | 264/40.1 |
| 5,584,959 A | 12/1996 | Kimura et al. | 156/345 |
| 5,589,148 A | 12/1996 | Otsuka et al. | |
| 5,597,495 A * | 1/1997 | Keil et al. | 216/66 |
| 5,597,540 A | 1/1997 | Akita et al. | |
| 5,609,736 A | 3/1997 | Yamamoto | |
| 5,643,545 A | 7/1997 | Chen et al. | |
| 5,663,476 A | 9/1997 | Cripe et al | |
| 5,680,013 A | 10/1997 | Dornfest et al. | |
| 5,720,444 A | 2/1998 | Wheeler et al. | 242/364.1 |
| 5,720,931 A | 2/1998 | Rossin et al. | 423/236 |
| 5,750,823 A | 5/1998 | Wofford et al. | |
| 5,753,044 A | 5/1998 | Hanawa et al. | |
| 5,762,893 A | 6/1998 | Scholz et al. | 423/240 S |
| 5,779,863 A | 7/1998 | Ha et al. | 203/74 |
| 5,779,998 A | 7/1998 | Tom | |
| 5,798,016 A | 8/1998 | Oehrlein et al. | |
| 5,817,284 A | 10/1998 | Nakano et al. | |
| 5,843,288 A | 12/1998 | Yamamoto | 204/164 |
| 5,858,065 A | 1/1999 | Li et al. | 95/45 |
| 5,865,879 A | 2/1999 | Lee | 95/273 |
| 5,895,586 A | 4/1999 | Kaji et al. | |
| 5,914,091 A | 6/1999 | Holst et al. | 422/173 |
| 5,955,037 A | 9/1999 | Holst et al. | |
| 6,187,072 B1 | 2/2001 | Cheung et al. | |

* cited by examiner

EROSION RESISTANT GAS ENERGIZER

BACKGROUND

The present invention is related to an apparatus and method for reducing a hazardous gas content of an effluent from a process chamber.

Fluorocarbon, chlorofluorocarbons, hydrocarbon, and other fluorine containing gases are used in, or formed as a byproduct during, the manufacture of integrated circuits in process chambers. These gases are toxic to humans and hazardous to the environment. In addition, they may also strongly absorb infrared radiation and have high global warming potentials. Especially notorious are persistent fluorinated compounds or perfluorocompounds (PFCs) which are long-lived, chemically stable compounds that have lifetimes often exceeding thousands of years. Some examples of PFCs are carbon tetrafluoride ($CF_4$), hexafluoroethane ($C_2F_6$), octafluorocyclopropane or perfluorocyclobutane ($C_4F_8$), difluoromethane ($CH_2F_2$), hexafluorobutadiene or perfluorocyclobutane ($C_4F_6$), perfluoropropane ($C_3F_8$), trifluoromethane ($CHF_3$), sulfur hexafluoride ($SF_6$), nitrogen trifluoride ($NF_3$), and the like. For example, $CF_4$ has a lifetime in the environment of about 50,000 years and can contribute to global warming for up to 6.5 million years. Thus it is desirable to have an apparatus or method that can reduce the hazardous gas content of effluents, and especially PFCs, that may be released from process chambers.

Perfluorocompounds are utilized in numerous semiconductor fabrication processes. For example, perfluorocompounds are used in the etching of layers on substrates, such as oxide, metal and dielectric layers. Perfluorocompounds can also be used during chemical vapor deposition processes. Additionally, process chambers can be cleaned of etch or deposition residue using perfluorocompounds. These hazardous compounds are either introduced into a process chamber or are formed as byproducts within the process chamber and may be exhausted from the chamber in an effluent gas stream.

Thus, it is desirable to minimize the introduction of such harmful gases and byproducts into the environment. There is also a need to minimize the harmful content of the effluent gas released into the atmosphere in an efficient and inexpensive manner. There is a further need to reduce PFC and other harmful gases to the lowest possible levels, preferably by at least about 95%, especially for industries which widely use PFCs, even though such use is a relatively small component of the overall consumption or release of PFCs in the world.

SUMMARY

The present invention is useful for reducing a content of hazardous gases, such as PFCs, in an effluent gas, such as an effluent that results from processing of substrates, for example semiconductor wafers and other electronic devices. By hazardous gas it is meant any toxic, harmful or undesirable gas, including but not limited to PFCs, chlorofluorocarbons (CFCs), hydrocarbons, other fluorine containing gases, and other undesirable gases.

In one aspect of the invention, a gas energizing apparatus comprises a reactor adapted to receive gas, the reactor comprising an inner surface comprising a fluorine-containing compound. The apparatus also comprises a gas energizer to energize the gas in the reactor.

In another aspect of the invention, a gas treatment apparatus capable of treating an effluent gas from a process chamber comprises a reactor adapted to receive the effluent gas, the reactor comprising an inner surface comprising a fluorine-containing compound, and a gas energizer to energize the effluent in the reactor to treat the effluent gas.

In another aspect of the invention, a method of energizing a gas comprises providing an inner surface comprising a fluorine-containing compound in a reactor, introducing gas into the reactor, and energizing the gas in the reactor.

In another aspect of the invention, a method of treating an effluent gas from a chamber comprises performing a process in a process chamber to generate an effluent gas, providing an inner surface comprising a fluorine-containing compound in a reactor, introducing the effluent gas into the reactor, and energizing the effluent gas in the reactor to treat the effluent gas.

In another aspect of the invention, a gas energizing apparatus comprises a reactor adapted to receive gas, the reactor comprising an inner surface comprising a material comprising an oxide and a thermal transformation stabilizing agent and a gas energizer adapted to energize the gas in the reactor.

In another aspect of the invention, a method of energizing a gas comprises providing an inner surface comprising a material comprising an oxide and a thermal transformation stabilizing agent in a reactor, introducing gas into the reactor, and energizing the gas in the reactor.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

The present invention relates to a gas treatment apparatus for use with a process chamber and a method of abating a hazardous gas content of effluent from the process chamber. The description and accompanying drawings represent illustrative embodiments of the invention and are not intended to limit the invention.

Figure 1:
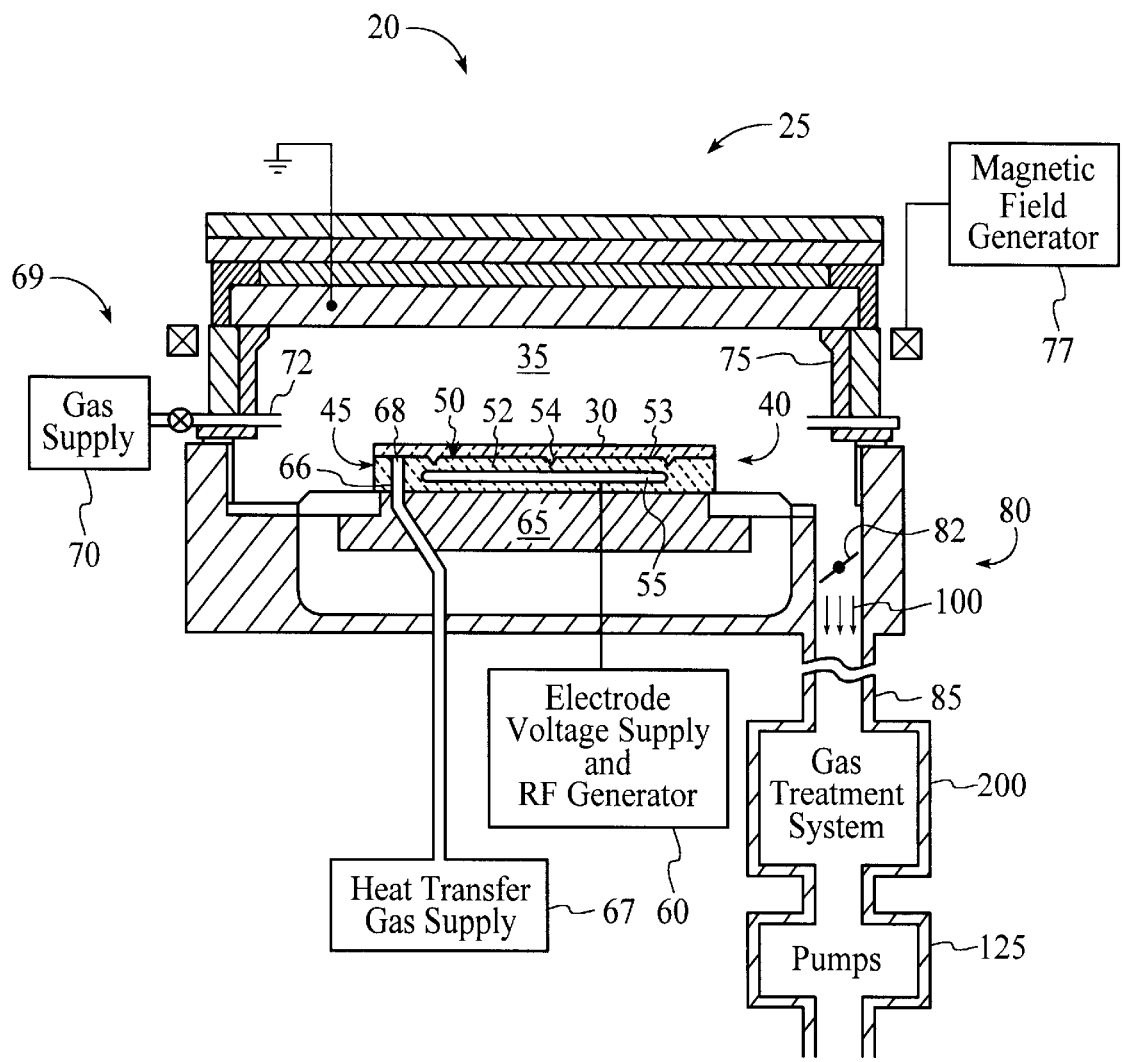
FIG. 1 is a schematic sectional side view of an exemplary processing apparatus for processing a substrate and producing effluent containing hazardous gases showing a gas treatment system in the exhaust.

An exemplary processing apparatus 20, as illustrated in FIG. 1, comprises a chamber 25 such as for example, an MxP, MxP+, or an MxP super e chamber, commercially available from Applied Materials Inc., Santa Clara, Calif., and generally described in commonly assigned U.S. Pat. Nos. 4,842,683 and 5,215,619 to Cheng, et al; and U.S. Pat.

No. 4,668,338 to Maydan, et al., all of which are incorporated herein by reference in their entireties. Such chambers can be used in a multi-chamber integrated process system as for example, described in U.S. Pat. No. 4,951,601 to Maydan, et al., which is also incorporated herein by reference in its entirety. The particular embodiment of the chamber 25 shown herein, is suitable for processing of substrates 30, such as semiconductor wafers. The exemplary embodiment is provided only to illustrate the invention, and should not be used to limit the scope of the invention.

During processing, the chamber 25 is evacuated to a low pressure of less than about 500 mTorr, and a substrate 30 is transferred to a plasma zone 35 of the chamber 25 from a load lock transfer chamber (not shown) maintained at vacuum. The substrate 30 is held on a support 40, which optionally comprises a mechanical or electrostatic chuck 45. A typical electrostatic chuck 45 comprises an electrostatic member 50 comprising a dielectric layer 52 having a surface 53 adapted to receive the substrate 30. The dielectric layer 52 covers an electrode 55—which may be a single conductor or a plurality of conductors—which is chargeable to electrostatically hold the substrate 30. After the substrate 30 is placed on the chuck 45, the electrode 55 is electrically biased with respect to the substrate 30 by an electrode voltage supply 60 to electrostatically hold the substrate 30. A base 65 below the electrostatic chuck 45 supports the chuck, and optionally, is also electrically biased with an RF bias voltage. The surface 53 may have grooves 54 in which a heat transfer gas, such as helium, is held to control the temperature of the substrate 30. The heat transfer gas is provided via gas conduits 66 having one or more outlets 68 that deliver the gas to the surface 53 of the chuck 45 and that extend through one or more of the electrodes 55 and dielectric layer 52. A heat transfer gas supply 67 supplies heat transfer gas to the conduits 66 via a gas supply channel.

Process gas is introduced into the chamber 25 through a gas supply 69 that includes a first gas supply 70 and one or more gas nozzles 72 terminating in the chamber 25. The gas in the chamber 25 is typically maintained at a low pressure. A plasma is formed in the plasma zone 35 from the gas by coupling electromagnetic energy to the process gas. In the chamber 25, the plasma is capacitively generated by applying an RF voltage to the electrode 55 (which serves as the cathode electrode) and by electrically grounding the sidewalls 75 of the chamber 25 to form the other (anode) electrode 55. In an alternative embodiment (not shown), the process gas may be energized by applying an RF current to an inductor coil (not shown) adjacent the chamber 25 to inductively couple energy into the chamber 25 and generate the plasma in the plasma zone 35. The frequency of the RF current applied to the electrode 55 or to the inductor coil (not shown) is typically from about 50 KHz to about 60 MHz. The capacitively generated plasma can also be enhanced by electron cyclotron resonance in a magnetically enhanced reactor in which a magnetic field generator 77, such as a permanent magnet or electromagnetic coils, provides a magnetic field that may increase the density and uniformity of the plasma in the plasma zone 35. Preferably, the magnetic field comprises a rotating magnetic field with the axis of the field rotating parallel to the plane of the substrate 30, as described in U.S. Pat. No. 4,842,683.

Effluent 100 comprising process gas and process byproducts is exhausted from the chamber 25 through an exhaust system 80 capable of achieving a low pressure in the chamber 25. The exhaust system 80 comprises an exhaust tube 85 that leads to one or a plurality of pumps 125, such as roughing and high vacuum pumps, that evacuate the gas in the chamber 25. A throttle valve 82 is provided in the exhaust tube 85 for controlling the pressure of the gas in the chamber 25. Also, an optical endpoint measurement technique may be used to determine completion of the etching process by measuring a change in radiation emission intensity of a gas species in the chamber 25 or measuring the intensity of radiation reflected from a layer being processed on the substrate 30.

During operation of the chamber 25 in a typical process, a substrate 30 is placed on the support 40 in the process chamber 25, and a process gas comprising, for example, halogen-containing gas, such as fluorine-containing gas, for example $CF_4$, $C_2F_6$, $C_3F_8$, $CHF_3$, $SF_6$, $NF_3$, $CH_3F$, $C_4F_8$, $CH_2F_2$, $C_4F_6$ and equivalents thereof, is introduced into the process zone 35 through the gas supply 69. The process gas is energized by the gas energizer 60 in the chamber 25 to, for example, process the substrate 30 in an electromagnetically energized plasma gas or a microwave energized gas. Alternatively, the gas may be energized in a remote chamber (not shown) and then introduced into the chamber 25. During and after processing, an effluent gas stream 100 of spent process gas and gaseous byproducts is exhausted from the process chamber 25 and into the exhaust tube 85. The fluorine-containing gas can also be used in a process chamber cleaning process.

Figure 2:
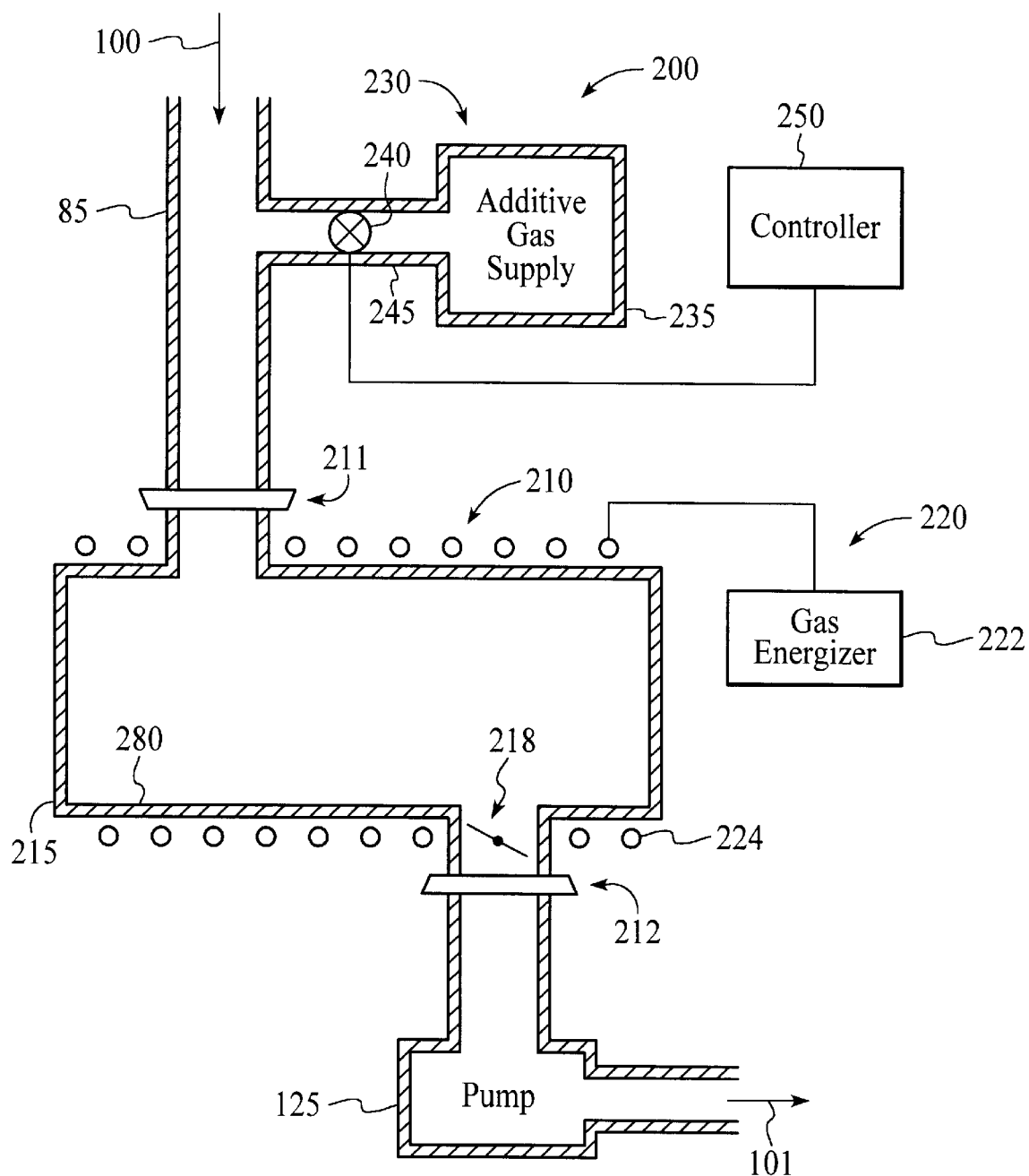
FIG. 2 is a schematic of an embodiment of a gas treatment system with a gas energizing reactor.

To treat the effluent 100, for example abating hazardous and undesirable gases, such as PFC gases, from the effluent 100, the effluent 100 may be passed through a gas treatment system 200 comprising a gas energizing reactor 210. The effluent gas 100 may be delivered through exhaust tube 85 to the gas energizing reactor 210, such as a plasma reactor as shown for example in FIG. 2. The gas energizing reactor 210 is a reactor for energizing a gas, including for example microwave activation reactors and is not limited to reactors for generating a plasma. In flowing from a reactor inlet 211 to a reactor outlet 212, energy is coupled to the effluent 100 in a reactor chamber 215 by applying energy from a gas energizing system 220 to the chamber 215. The energized gas forms a plasma in the reactor chamber 215 generating free radicals from the components in the effluent 100. In the gas energizing reactor 210, the free radicals combine to produce an abated effluent 101 that has a reduced hazardous gas content.

Figure 3:
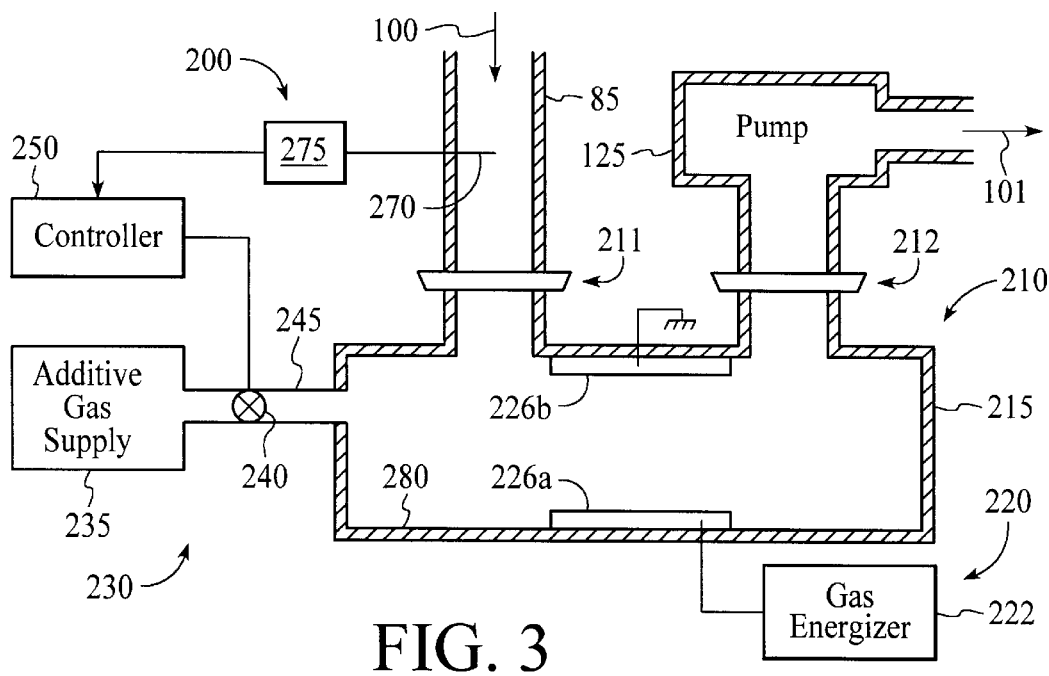
FIG. 3 is a schematic of another embodiment of a gas treatment system with a gas energizing reactor.
Figure 4:
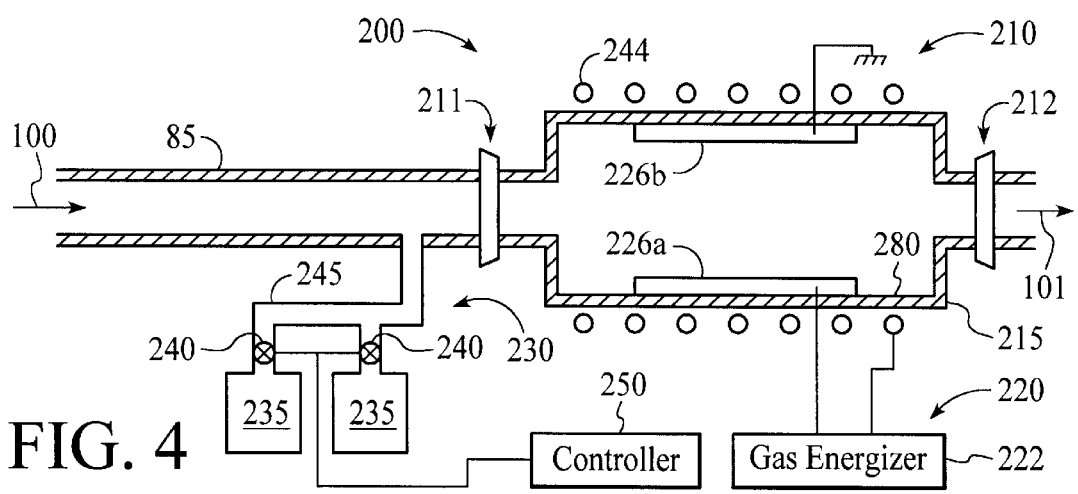
FIG. 4 is a schematic of another embodiment of a gas treatment system with a gas energizing reactor.

The gas energizing system 220 may, in one version, inductively or capacitively couple RF energy to the gas energizing reactor 210 to form charged ionized species in the reactor chamber 215. In the embodiment shown in FIG. 2, the gas energizing system 220 comprises a gas energizer power supply 222 and an inductor antenna 224 around or adjacent to the reactor chamber 215. The gas energizer power supply 222 may comprise an RF energy coupling system including an RF source and an RF match network that supplies a gas energizing RF voltage to the antenna 224 to form an energized gas or plasma in the reactor chamber 215. In an alternative arrangement, such as the one shown in FIG. 3, a pair of electrodes 226a,b can be positioned in the reactor chamber 215 (as shown) or outside the reactor chamber 215 (not shown). The gas energizing system 220 in this embodiment comprises a gas energizer power supply 222 that applies an RF bias voltage to one of the electrodes 226a and the other electrode 226b is maintained at a different potential, such as ground, in order to capacitively couple the electrodes 226a,b. In another alternative configuration, as shown in FIG. 4, a combination of inductively coupled and capacitively coupled energy can be used to energize the effluent 100. A gas energizing reactor is disclosed in U.S. patent application Ser. No. 09/363,250, filed on Jul. 28, 1999, which is incorporated herein by reference. Gas energizing reactors are also available from Applied Science and Technology, Inc. in Woburn, Mass.

The inductively or capacitively operating gas energizing system 220 may be designed to adequately energize the effluent 100 in the reactor chamber 215 to reduce the hazardous gas content therein. In one version, the gas energizer power supply 222 comprises an RF gas energizer capable of producing a power output of at least 500 Watts. The RF gas energizer power supply 222 may have a variable power output which can be remotely adjusted by an operator or a controller from about 500 to about 5000 Watts. The inductor antenna 224 may comprise one or more inductor coils having a circular symmetry with a central axis coincident with the longitudinal axis that extends through the center of the reactor chamber 215. For example, the inductor antenna 224 can comprise a longitudinal spiraling coil that wraps around the reactor chamber 215 to couple RF energy to the effluent 100 traveling through the reactor chamber 215. The inductor antenna 224 may extend across a length that is sufficiently long to energize an extended path-length of effluent gas 100 flowing through the reactor chamber 215 to abate substantially all the hazardous gas species in the effluent 100, as the effluent 100 flows through the gas energizing reactor 210. Optionally, the inductor antenna 224 can be located inside the reactor chamber 215. In the version shown in FIGS. 3 and 4, the electrodes 226a,b have a symmetry with a central axis coincident with the longitudinal axis that extends through the center of the reactor chamber 215. In one version, the electrodes 226a,b comprise flat parallel plates separated by a distance that is sufficiently small to couple energy into the effluent gas 100 flowing between the plates 226a,b. In another version, the electrodes 226a,b comprise opposing semi-cylindrical curved plates that are aligned on the walls of the reactor chamber 215. As with the inductor antenna 224, the length of each of the facing electrodes 226a,b is sufficiently long to energize an extended path-length of effluent gas 100 that flows through the gas energizing reactor 210 to abate substantially all the hazardous gas species in the effluent 100.

Figure 5:
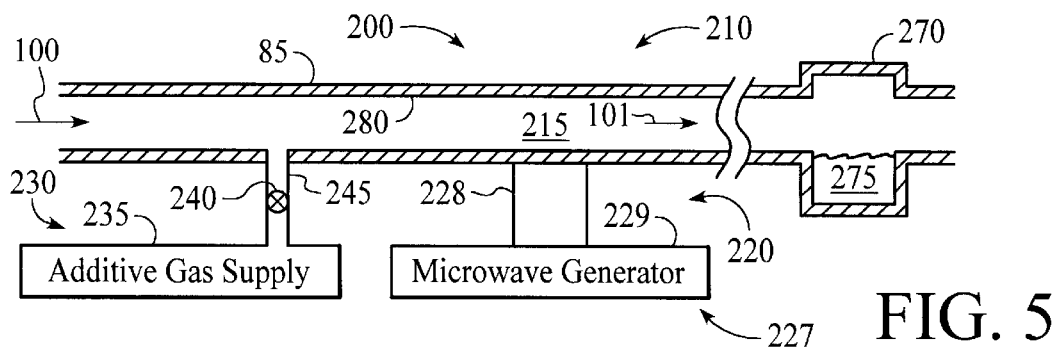
FIG. 5 is a schematic of another embodiment of a gas treatment system with a gas energizing reactor.

In another version, the gas energizing system 220 comprises a gas activator 227 that provides microwaves that chemically activate the effluent gas 100 in the reactor chamber 215 by formation of a highly dissociated gas. In this version, as schematically illustrated in FIG. 5, the gas activator 227 comprises a microwave waveguide 228 powered by a microwave generator 229, such as an "ASTEX" Microwave Plasma Generator commercially available from the Applied Science & Technology, Inc., Woburn, Mass. Typically, the microwave generator 229 comprises a microwave tuning assembly and a magnetron microwave generator capable of generating microwaves at a frequency of 2.54 GHz. Typically, the magnetron comprises a high power microwave oscillator in which the potential energy of an electron cloud near a central cathode is converted into microwave energy in a series of cavity resonators spaced radially around the cathode. The resonant frequency of the magnetron is determined by the physical dimensions of the resonator cavities. The waveguide 228 may have a rectangular cross-section, the interior dimensions of which are selected to optimize transmission of radiation at a frequency corresponding to the operating frequency of the microwave generator. For example, for a microwave generator operating at 2.45 GHz, the waveguide 228 forms a rectangle of 5.6 cm by 11.2 cm. The tuning assembly may comprise a short segment of waveguide (not shown) that is closed on one end, and that is positioned on the opposite side of the reactor chamber 215 from and in line with the waveguide 228. A plunger (not shown) may be used to alter the axial length of a cavity defined by the tuning assembly to vary the point at which the electromagnetic field is concentrated. This plunger is not meant to be moved during routine operation, rather it is positioned during initial startup to attain highest possible electric field inside the reactor chamber 215.

The gas energizing reactor 210 may be designed to maximize the energy applied to the effluent 100 in the gas treatment system 200, and to allow the effluent to flow through the gas treatment system 200 in a continuous stream of effluent 100. The shape and size of the reactor chamber 215 may be selected to provide unrestricted and continuous flow of effluent from the process chamber 25 while preventing back diffusion of the effluent 100 into the process chamber 25. The exhaust tube 85 and reactor chamber 215 may comprise a cross-sectional area (in a plane perpendicular to the flow of effluent 100) that is sufficiently large to flow the effluent gas 100 at a rate that is equal to or greater than the rate at which process gas is supplied to the chamber, otherwise, a back pressure of process gas is formed in the process chamber 25. In one version, the exhaust tube 85 and reactor chamber 215 comprise a diameter of at least about 5 mm, and more preferably of at least about 35 mm. The reactor inlet 211 and the reactor outlet 212 in the reactor chamber 215 may be offset, as shown for example in FIGS. 2 and 3, to increase the residence time of the effluent 100 in the reactor chamber 215, or may be linearly oriented, as shown for example in FIG. 4, to reduce hindrance to the flow of effluent 100 therethrough and thereby further prevent the backflow of effluent 100 into the process chamber 25. In one version, a throttle valve 218 may be provided in or near the reactor chamber 215 to control the flow of effluent 100 in and out of the gas energizing reactor 210. The throttle valve 218 may optionally be under the control of a controller. In yet another version, a throttle valve or a one-way valve may be provided at or near the inlet 211 to prevent the backflow of effluent 100.

In one version, the reactor chamber 215 comprises a hollow cylinder having a longitudinal central axis that is oriented parallel to the direction of the flow path of effluent 100, and which can be easily adapted to existing process chamber designs. The length of the plasma reactor is sufficiently long to allow the effluent to remain resident in the tube for a sufficient time to abate substantially all of the hazardous gas content of the effluent. The precise length of the reactor chamber 215 depends on a combination of factors including the diameter of the exhaust tube, the composition and peak flow rate of the effluent 100, and the power level applied to the abatement plasma. For an effluent 100 comprising $CF_4$ and $O_2$ at total flow of about 1000 sccm, and an RF gas energizer 222 operated at about 1500 Watts, a sufficient resident time is at least about 0.01 seconds, and more preferably about 0.1 seconds.

A suitable length of reactor chamber 215 that provides such a residence time, comprises a cylindrical tube having a cross-sectional diameter of 35 mm, and a length of from about 20 cm to about 50 cm.

In an embodiment of the gas treatment system 200 shown in FIG. 5, the exhaust tube 85 serves as the reactor chamber 215. The exhaust tube 85 in this embodiment comprises an enclosed conduit through which a continuous stream of effluent 100 flows as the effluent 100 is energized by the gas energizing system 220 to abate the hazardous gas content of the effluent 100. The exhaust conduit 85 has an inlet that forms a gas tight seal with an exhaust port of the process chamber 25, and an outlet that forms a gas tight seal with pump 125 or with an intermediate member. The inner surfaces of the exhaust tube 85 are composed of gas impermeable material that has sufficient strength to withstand operating vacuum type pressures of $10^7$ Torr.

In one embodiment, the exhaust tube 85 and/or the reactor chamber 215 is placed in a vertical orientation directly beneath the process chamber 25. This embodiment provides a more laminar and less turbulent flow of effluent along the flow path. The laminar flow eliminates turbulence of the effluent gas flow stream and reduces the possibility that effluent gas will diffuse back into the process chamber 25. In addition, a laminar flow of effluent allows energizing radiation to be coupled in a high strength in the region immediately adjacent to the inner surface of the reactor chamber 215 to form a higher density of energized effluent gas or plasma. Also, because the effluent flows continually and uniformly past the inner surface of the reactor chamber 215, the deposition of byproducts on the inner surface, which would otherwise accumulate and impede the coupling of the ionizing radiation, make it unnecessary to frequently clean the reactor chamber 215.

The gas treatment apparatus 200 of the present invention may also include a cooling jacket (not shown) at least partially enclosing the reactor chamber 215, forming an annulus through which a coolant is passed to remove excess heat generated by the abatement plasma. The material of the cooling jacket is selected to withstand the mechanical and thermal stresses of the application. Preferably, the material of the cooling jacket comprises a coefficient of thermal expansion, similar to that of the reactor chamber 215 so that the dimensions of the cooling annulus remain constant. In one version, the cooling jacket further comprises a window of material transparent to microwave and RF radiation so that the gas energizing system 220 can couple the ionizing radiation through the cooling jacket and coolant to the effluent 100 inside the reactor chamber 215.

Referring again to FIG. 2, the gas treatment system 200 may further include an additive gas source 230. The additive gas source 230 may comprise an additive gas supply 235 and a control valve 240 in a conduit 245 leading from the additive gas supply 235 to the exhaust tube 85. The operation of the valve 240 may be under the control of a controller 250, such as a computer, or may be operated by hand. In alternative versions to the one shown in FIG. 2, the additive gas source 230 may introduce additive gas directly into the reactor chamber 215, as shown in FIG. 3, and/or may comprise multiple gas supplies 235 and valves 240, as shown in FIG. 4.

The additive gas source 230 mixes an additive gas into the effluent gas 100, before, as or after the effluent 100 is energized, to enhance abatement of the hazardous gas emissions. When energized, the additive gas dissociates or forms energized species that react with the energized hazardous gas species to create gaseous compounds that are non-toxic, or soluble and easily removed by a wet scrubber located downstream in the exhaust system. The addition of even a small amount of additive gas to the effluent gas 100 can significantly improve abatement efficiency. The additive gas conduit 245 may be positioned sufficiently close to the inlet of the exhaust tube 85 to allow the additive gas to completely mix with and react with the hazardous gas in the effluent 100. For example, the additive gas conduit 245 may be located less than about 10 cm from the inlet of the exhaust tube 85 and oriented to provide good mixing. Also, the conduit 245 may comprise an injection nozzle outlet that directs the additive gas into the exhaust tube 85, such that the additive gas forms a laminar stream flowing in the same direction as the direction of the laminar flow of the effluent 100, and along the inner surface of the exhaust tube 85. For example, the outlet of the conduit 245 may be in an angular orientation relative to the interior surface of the exhaust tube 85 to flow the additive gas into the exhaust tube 85 in the same direction as the effluent gas 100. The valve 240 (or mass flow controller) in the additive gas conduit 245 allows an operator or an automatic control system to adjust the volumetric flow of the reagent gas to a level that is sufficiently high to abate substantially all the hazardous gas emissions of the effluent.

The additive gas may comprise one or more reactive gases to improve the hazardous gas reduction efficiency. In one version, the reactive gas comprises an oxygen-containing gas, such as one or more of $O_2$, $O_3$ or the like. The oxygen-containing gas combines with the effluent 100 in the exhaust tube or in the reactor chamber 215. In the reactor chamber 215, the effluent 100 and the additive gas are energized as described above. Disassociated hazardous gases, such as PFCs, are oxidized in the plasma and converted to reaction products, such as $CO_2$ and $COF_2$, that are exhaustible or are treatable for safe exhaustion. For example, the $CO_2$ can be safely exhausted and the $COF_2$ can either be exhausted or scrubbed before being exhausted. A scrubber 270 containing a scrubbing fluid 275, such as $H_2O$, can be provided in the abatement system 200 to convert reaction products in the abated effluent 101 to exhaustible products. The additive gas may additionally or alternatively comprise H or OH containing gas, for example $H_2$, $H_2O$, $SiH_4$, etc. The addition of such hydrogen containing species enhances the overall efficiency of PFC destruction as determined by chemical kinetic modeling.

The additive gas may additionally or alternatively comprise one or more inert or non-reactive gases, such as inert or carrier gases like Ar, Ne, He, Xe, or the like. By "non-reactive" gas it is meant one or more gases that are less reactive with the effluent 100 than the reactive gas. The non-reactive gas may assist in transporting the reactive gas to the reactor chamber 215 and/or may aid in striking and sustaining a plasma in the reactor chamber 215 or initiating and stabilizing activated gaseous species in the reactor chamber 215.

The reactor chamber 215 comprises an inner surface 280 that is composed of gas impermeable material that has sufficient strength to withstand operating vacuum type pressures of from about 5 to about 10 mTorr and operating temperatures of from about 50° C. to about 500° C. In addition, when an external antenna, electrode or microwave applicator is used, the inner surface 280 should be sufficiently permeable to the applied energy to allow the energy to pass therethrough and to energize the gas in the reactor chamber 215.

In one version, the reactor chamber 215 comprises an inner surface 280 comprising a fluorine-containing compound. The inner surface 280 is any surface in the reactor chamber 215 that is exposed to gas in the reactor chamber 215 and may be, for example, in the form of a wall of the reactor chamber 215 or a liner or coating on the wall of the reactor chamber 215. The inner surface 280 may be a surface in the reactor chamber 215 that defines or partially defines a plasma zone in the reactor chamber 215 or may be a surface within or in contact with a plasma zone. The inner surface 280 may, in one version, comprise fluorides, such as $BeF_2$, $MgF_2$, $CaF_2$, $SrF_2$, $BaF_2$, $RaF_2$, or the like.

Inner surfaces 280 comprising fluorine-containing compounds have been discovered to be highly resistant to erosion in the reactor chamber 215. For example, when fluorine containing hazardous gases, such as PFCs, are introduced into the reactor chamber 215, the fluorine-containing gases may be broken down to present erosive radicals and polymerizing species of the $C_XF_Y$ type. The erosive radicals can cause erosion of the inner surfaces 280 by etching the inner surfaces 280 in the reactor chamber 215. The polymerizing species can lead to polymer deposition on the inner surfaces 280. Additionally, fluorine containing reaction products, such as HF and $COF_2$, can be erosive, particularly when heated. The presence of oxygen, such as $O_2$ gas, in the introduced gas can also cause erosion because oxygen breaks down to form oxygen species in the plasma that can react with the chamber surfaces and oxidize the surfaces. The fluorine containing inner surfaces 280 have been shown to be significantly more resistant to these erosive environments than conventional inner surface materials, such as quartz and aluminum oxide, by presenting a beneficial dynamic balance between being deposited with polymer and being etched. For example, $MgF_2$ has been shown to be from about 3.5 to about 16 times more resistant to erosion than conventional materials. Other fluorine containing inner surfaces 280 have been shown to be up to about 12,000 times more resistant to erosion than conventional materials. The resulting longer life of the inner surface 280 translates to a longer operating life of the reactor chamber 215 and represents a significant savings in inner surface 280 or reactor chamber 215 replacement costs and the associated equipment downtime.

In another version, the inner surface 280 comprises fluorides of barium or calcium. It has been discovered that fluorides of barium or calcium, such as $BaF_2$ and $CaF_2$, provide unexpectedly high erosion resistance in polymerizing species environments, and particularly in polymerizing species and oxygen environments. The high erosion resistance of $BaF_2$ and $CaF_2$ is believed to be due to passivation protection by polymer formation. It is believed that the passivation is dependent on the thermal properties of the material. The thermal conductivity of $CaF_2$ and $BaF_2$ are comparable and are less than the thermal conductivity of $MgF_2$ (which is less thermally conductive than $Al_2O_3$). The lower thermal conductivity encourages passivating polymerization.

The high erosion resistance of $BaF_2$ and $CaF_2$ has been shown by testing a variety of materials in the reactor chamber 215. For each material, 1 $cm^2$ samples of the material was placed in the reactor chamber 215 under separate controlled hazardous gas containing effluent 100 energizing conditions. Etch rates of each material was determined by the weight loss of the material. The samples were exposed to PFC and $O_2$ plasmas, and weight measurements were taken after 1.5 hours and after 2.5 hours of exposure. The experiment was repeated for each material for accuracy. Prior to plasma exposure, the samples were processed for three hours at 400° C. to remove absorbed moisture. The samples were transported and stored in a dessicator.

Figure 6:
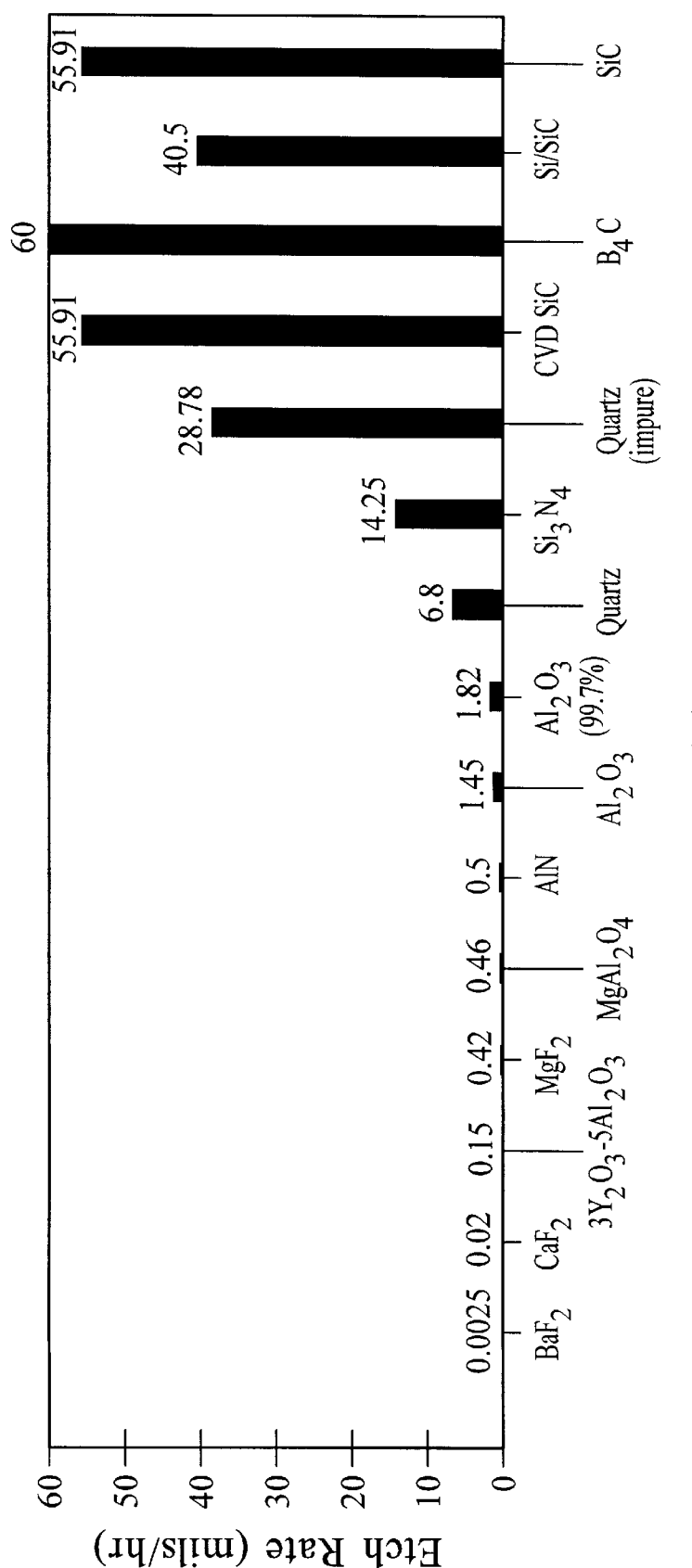
FIG. 6 is a graph showing the etch rate of different materials in a gas energizing reactor.

FIG. 6 shows a bar chart of the results of the test of the different materials. The $BaF_2$ and $CaF_2$ samples demonstrated an erosion resistance, represented by respective etch rates of 0.0025 and 0.02 mils per RF hour, vastly superior to all other tested materials. $BaF_2$ was 60 times more erosion resistant and $CaF_2$ was 7.5 times more erosion resistant than any other material and both were several orders of magnitude more resistant than conventional quartz and aluminum oxide. Furthermore, and unexpectedly, the $BaF_2$ and $CaF_2$ were over 150 times and over 20 times, respectively, more erosion resistant than the fluoride $MgF_2$.

As shown in FIG. 6, the material $3Y_2O_3.5Al_2O_3$ demonstrated erosion resistance an order of magnitude better than conventional materials. The $3Y_2O_3.5Al_2O_3$ material is a stable solution of yttrium oxide and aluminum oxide. It is believed that by mixing an oxide, such as aluminum oxide or zirconium oxide, with a thermal transformation stabilizing agent, such as a different oxide, provides superior erosion resistance to pure oxide (for example, aluminum oxide with greater than about 80% purity) because the mixture has a closely packed lattice structure that provides a diffusion barrier passivating layer. In the tested sample, the mixture was composed of about 50% $Y_2O_3$ and about 50 $Al_2O_3$.

Accordingly, in another embodiment of the invention, an inner surface 280 of the reactor chamber 215 comprises a mixture of an oxide and a thermal transformation stabilizing agent. In anther version, the inner surface 280 comprises a material that is a mixture of at least two oxides. For example, the inner surface 280 may comprise a material that comprises a mixture of at least 20% of two or more oxides. In another version, the inner surface 280 comprises a material that is composed of from about 20% to about 80% aluminum oxide or zirconium oxide. In another version the inner surface 280 comprises a ceramic compound and an oxide of a Group IIIB metal from the periodic table by Mendeleef and as shown on page 789 of The Condensed Chemical Dictionary, tenth edition as revised by Gessner G. Hawley, and published by Van Nostrand Reinhold Company. In yet another version, the inner surface 280 comprises a stable solution of yttrium oxide or other Group IIIB oxide and aluminum oxide or zirconium oxide.

Inner surfaces 280 or walls comprising material comprising at least two oxides, an oxide with a thermal deformation stabilizing agent, or a ceramic and a Group IIIB oxide has been further discovered to have additional unexpected advantages. For example, these mixtures can provide more mechanical strength over the pure oxide without significantly changing dielectric and/or thermal properties of the pure oxide.

When the inner surface 280 or wall comprises a ceramic compound and a Group IIIB oxide, the ceramic compound may be a compound that is typically electrically insulating and the crystallinity of which varies among amorphous, glassy, microcrystalline, and singly crystalline, dependent on material and its processing. The ceramic compound may be an essentially non-porous material. The ceramic compound may be any suitable ceramic compound that may combine with the oxide of Group IIIB metal to form a highly erosion-resistive ceramic structure. The ceramic compound may be, for example, one or more of silicon carbide (SiC), silicon nitride ($Si_3N_4$), boron carbide ($B_4C$), boron nitride (BN), aluminum nitride (AlN), aluminum oxide ($Al_2O_3$) and mixtures thereof. Other ceramics can alternatively be used.

The Group IIIB metal is a metal preferably selected from the group consisting of scandium (Sc), yttrium (Y), the cerium subgroup, the yttrium subgroup, and mixtures thereof. The cerium subgroup includes lanthanum (La), cerium (Ce), praseodymium (Pr), neodymium (Nd), promethium (Pm), and samarium (Sm). The yttrium subgroup includes europium (Eu), gadolinium (Gd), terbium (Tb), dysprosium (Dy), holmium (Ho), erbium (Er), thulium (Tm), ytterbium (Yb) and lutetium (Lu).

Inner surfaces 280 or walls comprising material comprising at least two oxides, an oxide with a thermal deformation stabilizing agent, or a ceramic and a Group IIIB oxide may be formed by any suitable ceramic manufacturing process.

In one version, inner surfaces are manufactured by the following steps: (i) admixing the ceramic compound in powdered form, and the oxide of a Group IIIB metal in powdered form with a suitable additive agent, and a suitable binder agent to produce a powdered raw mixture; (ii) forming the powdered raw mixture to produce a formed powdered raw mixture; (iii) thermal processing (i.e., sintering) the formed powdered raw mixture to produce a rough ceramic product; and (iv) finishing the rough ceramic product to produce a finished ceramic product. The powdered raw mixture which is to be subsequently formed comprises any suitable proportions of the ceramic compound, the oxide of a Group IIIB metal, the suitable additive agent and the suitable binder agent. The powdered raw mixture may comprise from about 10% by weight to about 85% by weight of the ceramic compound, from about 3% by weight to about 60% by weight of the oxide of a Group IIIB metal, from about 0.1% by weight to about 6% by weight of the suitable additive agent, and from about 5% by weight to about 35% by weight of the suitable binder agent. In one version, the powdered raw mixture comprises from about 20% by weight to about 75% by weight of the ceramic compound, from about 5% by weight to about 55% by weight of the oxide of a Group IIIB metal, from about 0% by weight to about 5% by weight of the additive agent, and from about 0% by weight to about 30% by weight of the binder agent. After the powdered raw mixture has been produced it is then subsequently formed into a formed powdered raw mixture. Forming may be accomplished by any suitable process (e.g. casting, extrusion, dry pressing, etc.) that includes compaction of the powdered raw mixture into a porous shape to achieve the greatest degree of particle packing and high degree of homogeneity. In one version, the formed powdered raw mixture is produced by dry pressing, die-pressing or uniaxial compaction. The formed powdered raw mixture may be thermally processed in any suitable manner, such as by sintering which provides interparticle bonding that generates the attractive forces needed to hold together the otherwise loose formed powdered raw mixture. After formed powdered raw mixture has been thermally processed, a rough ceramic product is produced. The rough ceramic product may be subsequently finally shaped, such as by grinding, lapping or polishing.

During operation of the gas treatment apparatus 200 in a typical fabrication process, a substrate 30, such as a semiconductor wafer, is placed on the support 40 in the process chamber 25, and a process gas comprising fluorine-containing gas such as $CF_4$, $C_2F_6$, $C_3F_8$, $CHF_3$, $SF_6$, $NF_3$, $CH_3F$, and the like, is introduced into the process zone 35 through the process gas distributor 72. The process gas is energized by the gas energizer 60 in the chamber 25 to process the substrate 30 in an RF or electromagnetic plasma gas or a microwave energized gas. Alternatively, the gas may be energized in a remote chamber. During and after processing, an effluent gas stream of spent process gas and gaseous byproducts are exhausted from the process chamber 25 through the exhaust tube 85 of the exhaust system 80 and gas treatment apparatus 200.

In the gas treatment system 200, an RF energy or microwave energy, is coupled to the effluent 100, and optionally to an additive gas, flowing from the exhaust tube 85, to form an abatement plasma in which hazardous gas components in the effluent 100 are dissociated or reacted with one another to substantially abate the hazardous gas content of the effluent 100. The radiation raises the energy of some electrons of the atoms of the effluent gas molecules to energies from 1 to 10 eV, thereby freeing electrons and breaking the bonds of the gas molecules to form dissociated atomic gaseous species. In an energized plasma gas, avalanche breakdown occurs in the gaseous stream when the individual charged species electrons and charged nuclei are accelerated in the prevalent electric and magnetic fields to collide with other gas molecules causing further dissociation and ionization of the effluent gas 100. The ionized or dissociated gaseous species of the energized effluent react with each other, or with other non-dissociated gaseous species, to form non-toxic gases or gases that are highly soluble in conventional gas scrubbers.

Thus, the gas treatment apparatus 200 and gas treating process are successful in reducing the hazardous gas content of an effluent 100 by at least about 90%, and preferably by at least about 95%, in a well controlled and consistent manner and with improved erosion resistance in the energized hazardous gas environment. The gas treatment system 200 may be a self-contained and integrated unit that is compatible with various process chambers 25. The gas treatment system 200 can be used to reduce a large variety of hazardous gases, including substantially all types of PFCs. The gas treatment system 200 has no impact on process chamber 25 operation and may be used with any process chamber that exhausts hazardous gases. The catalytic abatement system is convenient to handle and occupies less than 3 cubic feet for treating effluent from a single process chamber and less than 40 cubic feet for treating effluent from multiple process chambers.

Although the present invention has been described in considerable detail with regard to certain preferred versions thereof, other versions are possible. For example, the additive gas supplies 230 and the gas energizing systems 220 shown in FIGS. 2–5 may be interchangeable with each other. Also, the apparatus of the present invention can be used in other chambers and for other processes, such as physical vapor deposition and chemical vapor deposition. In addition, the materials disclosed as being useful in the reactor chamber are also useful on other gas-contacting surfaces in the effluent treatment system, such as on the inner surface of the exhaust tube. Therefore, the appended claims should not be limited to the description of the preferred versions contained herein.

What is claimed is:

1. An effluent gas energizing apparatus comprising:
   a reactor having an inlet adapted to receive an effluent gas, the reactor comprising an inner surface comprising a fluorine-containing compound; and
   a gas energizer to energize the effluent gas in the reactor by coupling RF or microwave energy through the inner surface of the reactor to the effluent gas in the reactor to form an ionized or dissociated gas.

2. An apparatus according to claim 1 wherein the fluorine-containing compound comprises a fluoride compound.

3. An apparatus according to claim 1 wherein the fluorine-containing compound comprises barium or calcium.

4. An apparatus according to claim 3 wherein the fluorine-containing compound comprises $BaF_2$ or $CaF_2$.

5. An apparatus according to claim 1 wherein the inner surface is on a wall of the reactor.

6. An apparatus according to claim 1 wherein the inner surface is on a liner or a coating in the reactor.

7. An apparatus according to claim 1 wherein the gas energizer is adapted to energize an effluent gas comprising a fluorocarbon gas.

8. An apparatus according to claim 1 wherein the inner surface is sufficiently permeable to RF or microwave energy to allow the RF or microwave energy to pass through the inner surface and energize the gas in the reactor.

9. A gas treatment apparatus capable of treating an effluent gas from a process chamber, the gas treatment apparatus comprising:

a reactor having an inlet adapted to receive the effluent gas from the process chamber, the reactor comprising an inner surface comprising a fluorine-containing compound; and a gas energizer to energize the effluent gas in the reactor by coupling RF or microwave energy through the inner surface of the reactor to the effluent gas to treat the effluent gas by forming an ionized or dissociated gas from the effluent gas.

10. An apparatus according to claim 9 wherein the fluorine-containing compound comprises a fluoride compound.

11. An apparatus according to claim 9 wherein the fluorine-containing compound comprises barium or calcium.

12. An apparatus according to claim 11 wherein the fluorine-containing compound comprises $BaF_2$ or $CaF_2$.

13. An apparatus according to claim 9 wherein the inner surface is on a wall of the reactor.

14. An apparatus according to claim 9 wherein the inner surface is on a liner or a coating.

15. An apparatus according to claim 9 further comprising an additive gas supply adapted to introduce an additive gas into the reactor.

16. An apparatus according to claim 9 wherein the inner surface is sufficiently permeable to RF or microwave energy to allow the RF or microwave energy to pass through the inner surface and energize the effluent gas in the reactor.

17. An apparatus according to claim 9 wherein the effluent gas comprises a hazardous gas and wherein the gas energizer is adapted to provide RF or microwave energy at a power level that is sufficiently high to energize the effluent gas to reduce the hazardous gas content in the effluent gas.

18. An apparatus according to claim 9 wherein the effluent gas comprises a hazardous gas and wherein the gas energizer is adapted to provide RF or microwave energy at a power level that is sufficiently high to energize the effluent to reduce the fluorocarbon gas content in the effluent gas.

19. A substrate processing apparatus comprising:

a chamber comprising a substrate support;

a gas distributor;

a chamber gas energizer;

a gas exhaust; and a gas treatment apparatus in the gas exhaust, the gas treatment apparatus comprising a reactor comprising an gas inlet adapted to receive a gas, and the reactor having an inner surface comprising a fluorine-containing compound and a reactor gas energizer to energize the gas in the reactor by coupling RF or microwave energy through the inner surface of the reactor to the gas in the reactor to treat the gas by forming an ionized or dissociated gas, whereby a substrate received on the substrate support may be processed by gas introduced into the chamber through the gas distributor, energized by the chamber gas energizer, exhausted by the gas exhaust, and treated by the gas treatment apparatus.

20. An apparatus according to claim 19 wherein the fluorine-containing compound comprises $BaF_2$ or $CaF_2$.

21. An apparatus according to claim 19 wherein the inner surface is on a wall of the reactor.

22. An apparatus according to claim 19 wherein the inner surface is sufficiently permeable to RF or microwave energy to allow the RF or microwave energy to pass through the inner surface and energize the gas in the reactor.

23. An apparatus according to claim 19 wherein the gas comprises a hazardous gas and wherein the reactor gas energizer is adapted to provide RF or microwave energy at a power level that is sufficiently high to energize the gas to reduce the hazardous gas content in the gas.

24. An apparatus according to claim 19 wherein the gas comprises a fluorocarbon gas and wherein the reactor gas energizer is adapted to provide RF or microwave energy at a power level that is sufficiently high to energizes the gas to reduce the fluorocarbon gas content in the gas.

25. An apparatus according to claim 19 wherein the fluorine-containing compound comprises a fluoride compound.

26. An apparatus according to claim 19 wherein the fluorine-containing compound comprises barium or calcium.

27. An apparatus according to claim 19 wherein the inner surface is on a liner or a coating in the reactor.

28. An apparatus according to claim 19 wherein the gas treatment apparatus further comprises an additive gas supply adapted to introduce an additive gas into the reactor.

29. An effluent gas energizing apparatus comprising:

a reactor having an inlet adapted to receive an effluent gas, the reactor comprising an inner surface comprising a fluorine-containing compound comprising a fluoride of barium or calcium; and a gas energizer to energize the effluent gas in the reactor by coupling RF or microwave energy through the inner surface of the reactor to the effluent gas in the reactor to form an ionized or dissociated gas.

30. An apparatus according to claim 29 wherein the fluorides of barium or calcium comprise $CaF_2$ or $BaF_2$.

31. An apparatus according to claim 29 wherein the inner surface is on a wall of the reactor.

32. An apparatus according to claim 29 wherein the inner surface is on a liner or coating in the reactor.

33. An apparatus according to claim 29 wherein the inner surface is sufficiently permeable to RF or microwave energy to allow the RF or microwave energy to pass through the inner surface and energize the gas in the reactor.

34. An apparatus according to claim 29 wherein the gas energizer is adapted to energize an effluent gas comprising a fluorocarbon gas.

35. A effluent gas treatment apparatus comprising:

a reactor having an inlet adapted to receive an effluent gas, the reactor having an inner surface comprising a fluoride of barium or calcium; and a gas energizer to energize the effluent gas in the reactor by coupling RF or microwave energy through the inner surface of the reactor to the effluent gas to treat the effluent gas by forming an ionized or dissociated gas from the effluent gas.

36. An apparatus according to claim 35 wherein the fluorides of barium or calcium comprise $CaF_2$ or $BaF_2$.

37. An apparatus according to claim 35 wherein the inner surface is on a wall of the reactor.

38. An apparatus according to claim 35 wherein the inner surface is on a liner or a coating in the reactor.

39. An apparatus according to claim 35 further comprising an additive gas supply adapted to introduce an additive gas into the reactor.

40. An apparatus according to claim 35 wherein the inner surface is sufficiently permeable to RF or microwave energy to allow the RF or microwave energy to pass through the inner surface and energize the effluent gas in the reactor.

41. An apparatus according to claim 35 wherein the effluent gas comprises a hazardous gas and wherein the gas energizer is adapted to provide RF or microwave energy at a power level that is sufficiently high to energize the effluent gas to reduce the hazardous gas content in the effluent gas.

42. An apparatus according to claim 35 wherein the effluent gas comprises a fluorocarbon gas and wherein the gas energizer is adapted to provide RF or microwave energy at a power level that is sufficiently high to energize the effluent gas to reduce the fluorocarbon gas content in the effluent gas.

43. A substrate processing apparatus comprising:

a process chamber comprising a substrate support, a gas distributor to introduce a gas in the process chamber, a chamber gas energizer to energize the gas in the process chamber, and a gas exhaust to exhaust an effluent gas from the chamber through an exhaust tube; and a gas treatment apparatus having an inlet connected to the exhaust tube to receive the effluent gas, the gas treatment apparatus comprising a reactor having an inner surface comprising a fluoride of barium or calcium, and an effluent gas energizer to energize the effluent gas in the reactor by coupling RF or microwave energy through the inner surface of the reactor to the effluent gas to treat the effluent gas by forming an ionized or dissociated gas from the effluent gas.

44. An apparatus according to claim 43 wherein the fluorides of barium or calcium comprise $CaF_2$ or $BaF_2$.

45. An apparatus according to claim 43 wherein the inner surface is on a wall of the reactor.

46. An apparatus according to claim 43 wherein the inner surface is on a liner or a coating in the reactor.

47. An apparatus according to claim 43 wherein the gas treatment apparatus further comprises an additive gas supply adapted to introduce an additive gas into the reactor.

48. An apparatus according to claim 43 wherein the inner surface is sufficiently permeable to RF or microwave energy to allow the RF or microwave energy to pass through the inner surface and energize the effluent gas in the reactor.

49. An apparatus according to claim 43 wherein the effluent gas comprises a hazardous gas and wherein the gas energizer is adapted to provide RF or microwave energy at a power level that is sufficiently high to energize the effluent gas to reduce the hazardous gas content in the effluent gas.

50. An apparatus according to claim 43 wherein the effluent gas comprises a fluorocarbon gas, and wherein the gas energizer is adapted to provide RF or microwave energy at a power level that is sufficiently high to energize the effluent gas to reduce a fluorocarbon gas content in the effluent gas.

* * * * *